(12) United States Patent
Kuo et al.

(10) Patent No.: US 10,236,208 B2
(45) Date of Patent: Mar. 19, 2019

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventors: Chin-Cheng Kuo, Kaohsiung (TW); Pao-Nan Lee, Kaohsiung (TW); Chih-Pin Hung, Kaohsiung (TW); Ying-Te Ou, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 29 days.

(21) Appl. No.: 15/184,828

(22) Filed: Jun. 16, 2016

(65) Prior Publication Data
US 2017/0365515 A1    Dec. 21, 2017

(51) Int. Cl.
| H01L 21/768 | (2006.01) |
| H01L 23/48  | (2006.01) |
| H01L 23/522 | (2006.01) |
| H01L 23/528 | (2006.01) |
| H01L 23/00  | (2006.01) |

(52) U.S. Cl.
CPC ...... H01L 21/76898 (2013.01); H01L 23/481 (2013.01); H01L 23/5225 (2013.01); H01L 23/5286 (2013.01); H01L 24/02 (2013.01); H01L 24/05 (2013.01); *H01L 2224/02372* (2013.01); *H01L 2224/02381* (2013.01); *H01L 2224/0401* (2013.01); *H01L 2224/05024* (2013.01); *H01L 2224/05562* (2013.01)

(58) Field of Classification Search
CPC ........... H01L 21/76898; H01L 23/5286; H01L 2224/05024; H01L 2224/02372; H01L 2224/06541
See application file for complete search history.

(56) References Cited

U.S. PATENT DOCUMENTS

| 6,521,530 | B2 * | 2/2003 | Peters | H01L 23/49822 257/621 |
| 8,242,604 | B2 | 8/2012 | Volant et al. | |
| 8,319,336 | B2 | 11/2012 | Chang et al. | |
| 8,541,883 | B2 | 9/2013 | Cheng et al. | |
| 8,709,936 | B2 | 4/2014 | Volant et al. | |
| 2002/0076919 | A1 * | 6/2002 | Peters | H01L 23/49822 438/637 |
| 2008/0093116 | A1 * | 4/2008 | Lee | H05K 1/0245 174/261 |
| 2009/0166846 | A1 * | 7/2009 | Pratt | H01L 21/76898 257/698 |
| 2010/0270670 | A1 * | 10/2010 | Yeo | H01L 21/76898 257/700 |

(Continued)

*Primary Examiner* — A. Sefer (74) *Attorney, Agent, or Firm* — Foley & Lardner LLP; Cliff Z. Liu (57) ABSTRACT

The present disclosure relates to a semiconductor package structure and a method of manufacturing the same. The semiconductor package structure includes a semiconductor substrate having a first surface and a second surface opposite the first surface. The semiconductor substrate has a space extending from the second surface to the first surface and an insulation body is disposed in the space. The semiconductor package structure includes conductive posts in the insulation body.

17 Claims, 8 Drawing Sheets

(56) References Cited

U.S. PATENT DOCUMENTS

| | | | | |
|---|---|---|---|---|
| 2010/0284140 A1* | 11/2010 | Corisis | .................... | H01L 23/66 |
| | | | | 361/679.31 |
| 2011/0133302 A1* | 6/2011 | Sulfridge | .......... | H01L 21/76898 |
| | | | | 257/466 |
| 2012/0068313 A1* | 3/2012 | Pagaila | ............. | H01L 21/76898 |
| | | | | 257/621 |
| 2013/0214296 A1* | 8/2013 | Mohammed | .......... | H01L 23/142 |
| | | | | 257/88 |
| 2014/0042617 A1* | 2/2014 | Uchiyama | ......... | H01L 21/76898 |
| | | | | 257/737 |
| 2015/0041990 A1* | 2/2015 | Sekine | ............. | H01L 21/76879 |
| | | | | 257/774 |
| 2015/0303110 A1* | 10/2015 | Tuttle | ................ | H01L 21/76898 |
| | | | | 438/637 |

* cited by examiner

SEMICONDUCTOR PACKAGE STRUCTURE AND METHOD OF MANUFACTURING THE SAME

BACKGROUND

1. Technical Field

The present disclosure relates to a semiconductor package structure and a method of manufacturing the same. In particular, the present disclosure relates to a semiconductor package having a fine-pitch structure that provides improved electrical performance.

2. Description of the Related Art

A through-silicon via (TSV) is an electrical connection passing through a silicon wafer or die. TSVs are high density and/or high performance interconnects used as an alternative to wire-bond and flip chips to create three-dimensional (3D) packages and 3D integrated circuits, because a density of TSVs can be substantially higher than a density of pads, and because a length of a connection through a TSV can be shorter than a wire bond or flip chip connection.

SUMMARY

In an aspect, a semiconductor device package includes a semiconductor substrate and conductive posts. The semiconductor substrate has a first surface and a second surface opposite the first surface. The semiconductor substrate has a space which extends from the second surface to the first surface, and an insulation body is disposed in the space. The conductive posts are disposed in the insulation body.

In an aspect, a semiconductor device package includes a semiconductor substrate, a first conductive post, a second conductive post, and an insulation layer. The substrate has a first surface and a second surface opposite the first surface. The first conductive post has a portion between the first surface and the second surface of the substrate. The second conductive post has a portion between the first surface and the second surface of the substrate. The insulation layer separates the portion of the first conductive post from the portion of the second conductive post.

In an aspect, a method of manufacturing a semiconductor device package includes: providing a semiconductor device which includes a semiconductor substrate having a first surface and a second surface opposite the first surface. The semiconductor device includes an active layer on the second surface of the semiconductor substrate. The method further includes forming a space in the semiconductor substrate to expose the active layer; forming an insulation layer in the space of the semiconductor substrate; forming holes in the insulation layer to expose the active layer; and forming conductive posts in the holes in the insulation layer.

DETAILED DESCRIPTION

Common reference numerals are used throughout the drawings and the detailed description to indicate the same or similar components. Embodiments of the present disclosure will be more apparent from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
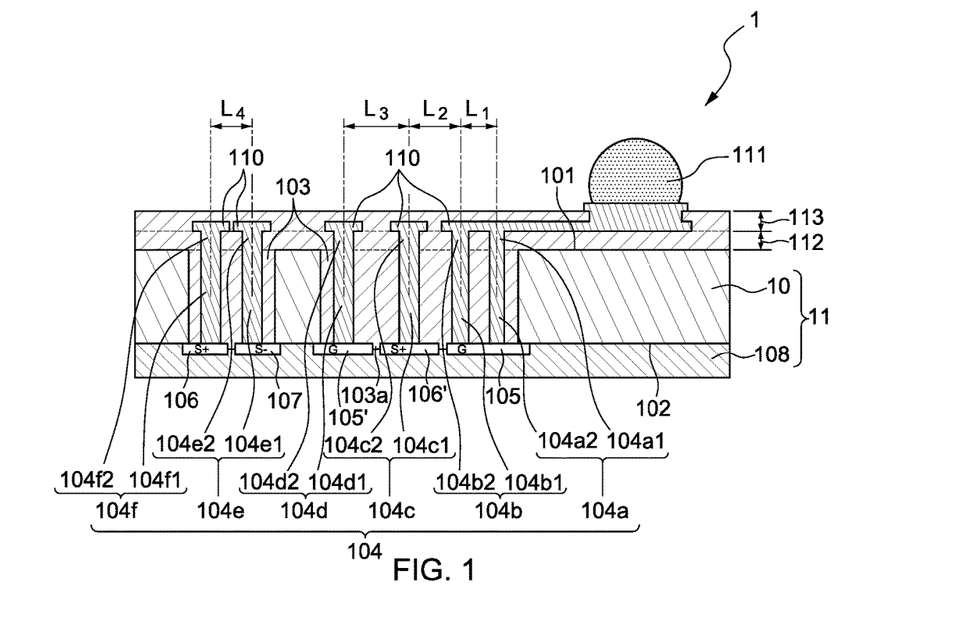
FIG. 1 is a cross-sectional view of a semiconductor device package in accordance with an embodiment of the present disclosure.

FIG. 1 is a cross-sectional view of a semiconductor device package 1 in accordance with an embodiment of the present disclosure. The semiconductor device package 1 includes a die 11 (e.g., a complementary metal-oxide-semiconductor (CMOS) die), an insulation body 103, conductive posts 104, a patterned conductive layer 110, a connection element 111, and insulation layers 112 and 113.

The die 11 includes a semiconductor substrate 10 and an active layer 108. The semiconductor substrate 10 may include silicon (Si). The semiconductor substrate 10 has a surface 101 and a surface 102. The surface 101 is opposite the surface 102. The active layer 108 is disposed on the surface 102 of the semiconductor substrate 10. Conductive pads 105, 105', 106, 106' and 107 are disposed in the active layer 108. The conductive pads 105, 105', 106, 106' and 107 are disposed on the surface 102 of the semiconductor substrate 10. In one or more embodiments, the conductive pads 105 and 105' are connected to ground paths and the conductive pads 106, 106' and 107 are used to transmit signals different from ground signals. The active layer 108 may include circuitry providing signal and ground paths to which the conductive pads 105, 105', 106, 106' and 107 are connected.

The insulation body 103 is formed in spaces between the surface 101 and the surface 102 of the semiconductor substrate 10. The spaces may be through holes in the semiconductor substrate 10. The insulation body 103 is disposed between the surface 101 and the surface 102 of the semiconductor substrate 10. The insulation body 103 includes protrusions 103a from the surface 102 toward a direction away from the surface 101. The insulation body 103 may include, for example, a passivation material, a resin, or a polymer.

The conductive posts 104 may include copper, another metal or metal alloy, or another suitable conductive material. The conductive posts 104 may include conductive posts 104a, 104b, 104c, 104d, 104e, and 104f. Each of the conductive posts 104a, 104b, 104c, 104d, 104e, and 104f has a lower portion (respectively 104a1, 104b1, 104c1, 104d1, 104e1, and 104f1), and a higher portion (respectively 104a2, 104b2, 104c2, 104d2, 104e2, and 104f2). Each of the higher portions 104a2, 104b2, 104c2, 104d2, 104e2, and 104f2 is extended from the respective lower portion 104a1, 104b1, 104c1, 104d1, 104e1, or 104f1. Each of the lower portions 104a1, 104b1, 104c1, 104d1, 104e1, and 104f1 is within the insulation body 103. The lower portions 104a1, 104b1, 104c1 and 104d1 are surround by and separated by the insulation body 103 in a first space between the surface 101 and the surface 102 of the semiconductor substrate 10. The lower portions 104e1 and 104f1 are surrounded by and separated by the insulation body 103 in a second space between the surface 101 and the surface 102 of the semiconductor substrate 10. The higher portions 104a2, 104b2, 104c2, 104d2, 104e2, and 104f2 extend through the insulation layer 112.

The conductive posts 104a and 104b are connected to the conductive pad 105. In one or more embodiments, the conductive pad 105 is connected to a single conductive post 104. In one or more embodiments, the conductive pad 105 is connected to three or more conductive posts 104. The conductive post 104d is connected to the conductive pad 105'. The conductive post 104c is connected to the conductive pad 106'. The conductive post 104f is connected to the conductive pad 106. The conductive post 104e is connected to the conductive pad 107. A dimension (e.g., width or length) of the conductive pad 105 is larger than a corresponding dimension of the conductive pad 105'.

The conductive posts 104a and 104b have a pitch therebetween of L1. The conductive posts 104b and 104c have a pitch therebetween of L2. The conductive posts 104c and 104d have a pitch therebetween of L3. The conductive posts 104e and 104f have a pitch therebetween of L4. Each of the pitches L1, L2, L3, and L4 may range from approximately 70 micrometers (μm) to approximately 110 μm. The relative pitches illustrated in FIG. 1 are not limiting, and may be designed according to an intended use of the semiconductor device package 1. For example, adjustment of the pitches L1, L2, L3, and L4 may provide flexibility in impedance matching for the semiconductor device package 1.

In one or more embodiments, the conductive pad 106 and the conductive pad 107 are designed as a differential signal pair for transmission of differential signals. For example, the conductive pad 106 is electrically connected to a first signal path and the conductive pad 107 is electrically connected to a second signal path, where the first signal path and the second signal path are designed to carry complementary signals. A reduction of the pitch L4 may provide better performance of the differential signal pair, such as by mitigating or compensating a mutual interference between the conductive posts 104e and 104f.

The patterned conductive layer 110 may include copper, another metal or metal alloy, or another suitable conductive material. The patterned conductive layer 110 is disposed on the insulation layer 112 or formed in the insulation layer 113. The patterned conductive layer 110 may include conductive pads, traces and wires. The patterned conductive layer 110 is electrically connected to the conductive posts 104.

The insulation layers 112 and 113 may include a same or different materials, and one or both of the insulation layers 112 and 113 may include a same or similar material to the insulation body 103. The insulation layer 112 separates the higher portions 104a2, 104b2, 104c2, 104d2, 104e2, and 104f2 from one another. The insulation layer 112 is disposed on the surface 101 of the semiconductor substrate 10 and on the insulation body 103.

The connection element 111 may be, for example, a solder bump or solder ball. The connection element 111 is electrically connected to the patterned conductive layer 110.

FIGS. 2A-2G illustrate a method of manufacturing a semiconductor device package in accordance with an embodiment of the present disclosure.

Figure 2A:
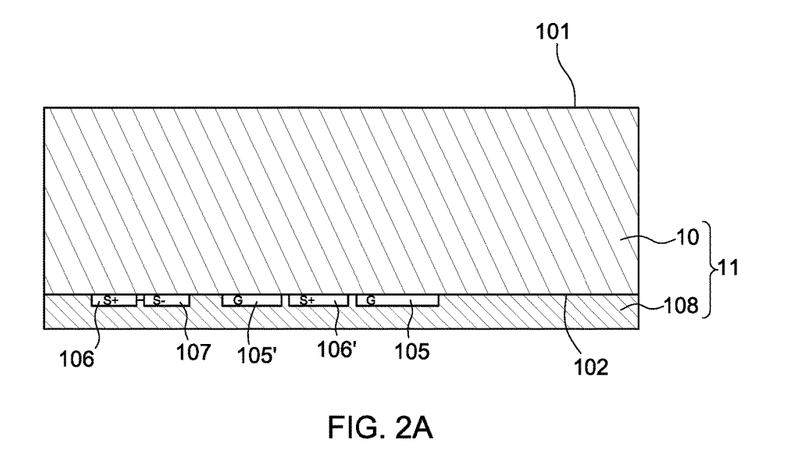
FIG. 2A, FIG. 2B, FIG. 2C, FIG. 2D, FIG. 2E, FIG. 2F and FIG. 2G illustrate a method of manufacturing a semiconductor device package in accordance with an embodiment of the present disclosure.

Referring to FIG. 2A, a die 11 is provided. The die 11 includes a semiconductor substrate 10 and an active layer 108. The semiconductor substrate 10 has a surface 101 and a surface 102. The surface 101 is opposite the surface 102. The active layer 108 includes conductive pads 105, 105', 106, 106', and 107. In one or more embodiments, the conductive pads 105 and 105' are connected to a ground path. In other embodiments, the conductive pads 105 and 105' are connected to other electrical signal paths. The conductive pads 106, 106', and 107 may be electrically connected to a same or different electrical signal paths. In one or more embodiments, the conductive pads 106 and 107 are electrically connected to differential (complementary) signal paths. The active layer 108 is disposed on the surface 102 of the semiconductor substrate 10. The conductive pads 105, 105', 106, 106', and 107 are disposed on the surface 102 of the semiconductor substrate 10.

Figure 2B:
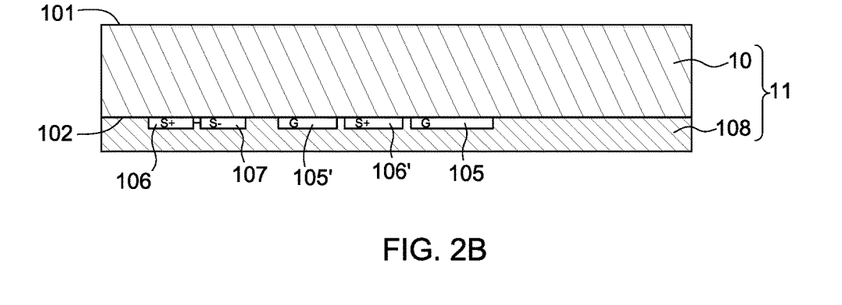

Referring to FIG. 2B, a portion of the semiconductor substrate 10 is removed (e.g., by grinding, chemical mechanical polishing (CMP), or other suitable technique) from the surface 101. In other words, the semiconductor substrate 10 is thinned from the surface 101.

Figure 2C:
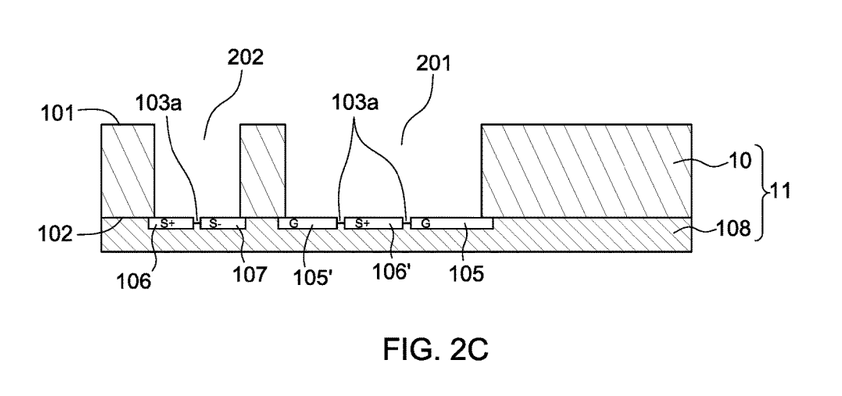

Referring to FIG. 2C, further portions of the semiconductor substrate 10 are removed (e.g., by photolithography and etching, or other suitable technique) to form a space 201 to expose the conductive pads 105, 105' and 106' and to form a space 202 to expose the conductive pads 106 and 107. The spaces 201 and 202 extend between the surface 101 and the surface 102 of the semiconductor substrate 10. A dimension (e.g., width or diameter) of the space 201 may be greater than a dimension (e.g., width or diameter) of the space 202. Recesses 103a are formed between the conductive pads 105' and 106', between the conductive pads 105 and 106' and between the conductive pads 106 and 107.

Figure 2D:
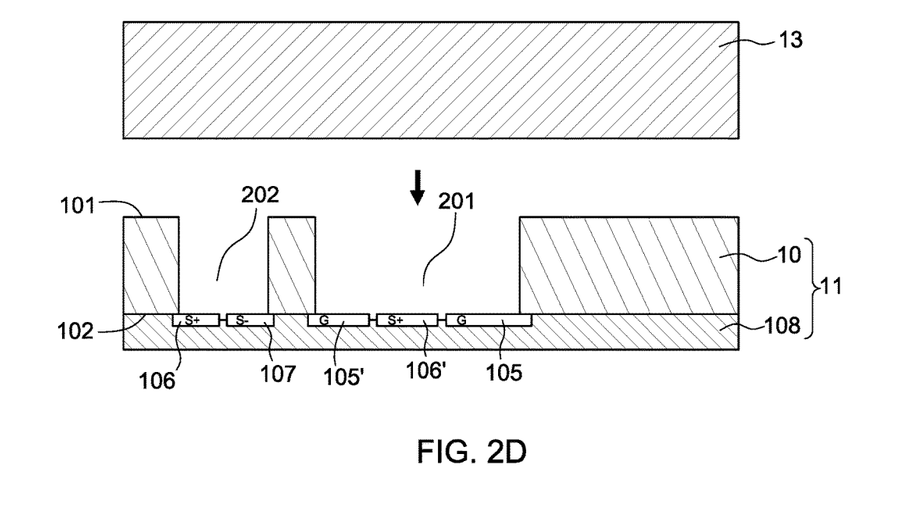

Referring to FIG. 2D, an insulation layer 13 is laminated to the surface 101 of the die 11. The lamination may be performed under a pressure that ranges from approximately 4 kilograms per square centimeter (kg/cm$^2$) to approximately 6 kg/cm2 and a temperature that ranges from approximately 80° C. to approximately 90° C. The insulation layer 13 may include, for example, a passivation material, a resin, or a polymer.

Figure 2E:
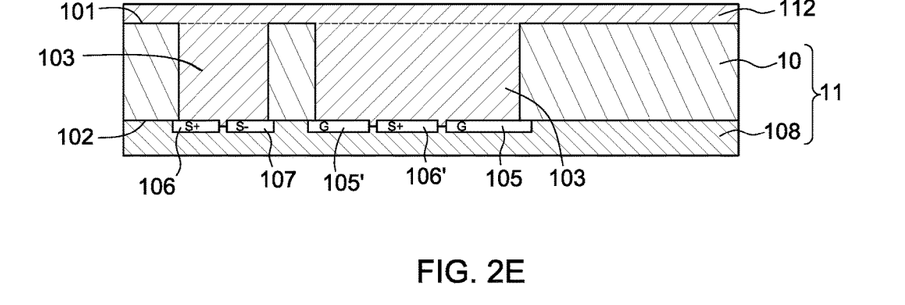

Referring to FIG. 2E, following lamination, an insulation body 103 fills the spaces 201 and 202. An insulation layer 112 is formed on the surface 101 and the insulation body 103.

Figure 2F:
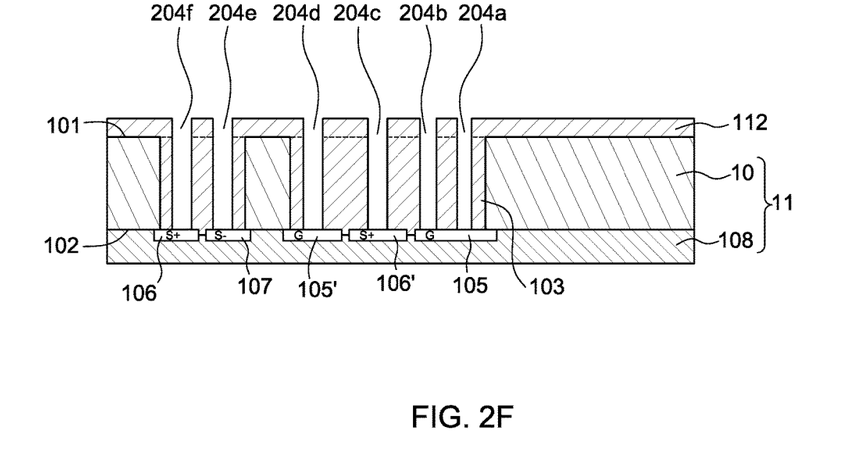

Referring to FIG. 2F, portions of the insulation layer 112 and the insulation body 103 are removed (e.g., by photolithography) to form holes 204a, 204b, 204c, 204d, 204e, and 204f. The holes 204a and 204b expose the conductive pad 105. The hole 204c exposes the conductive pad 106'. The hole 204d exposes the conductive pad 105'. The hole 204e exposes the conductive pad 107. The hole 204f exposes the conductive pad 106. A curing or heating operation may be performed to cure the insulation layer 112 and/or the insulation body 103. The curing or heating operation may be realized in a temperature that ranges from approximately 190° C. to approximately 230° C. The insulation layer 112 and the insulation body 103 may include photo-sensitive resin which is cured in the curing or heating operation.

Rather than using lithography, the holes 204a, 204b, 204c, 204d, 204e, and 204f may be formed using an optical technique to remove the portions of the insulation layer 112 and the insulation body 103. Optical techniques may more accurately control pitches between neighboring ones of the holes 204a, 204b, 204c, 204d, 204e, and 204f.

Figure 2G:
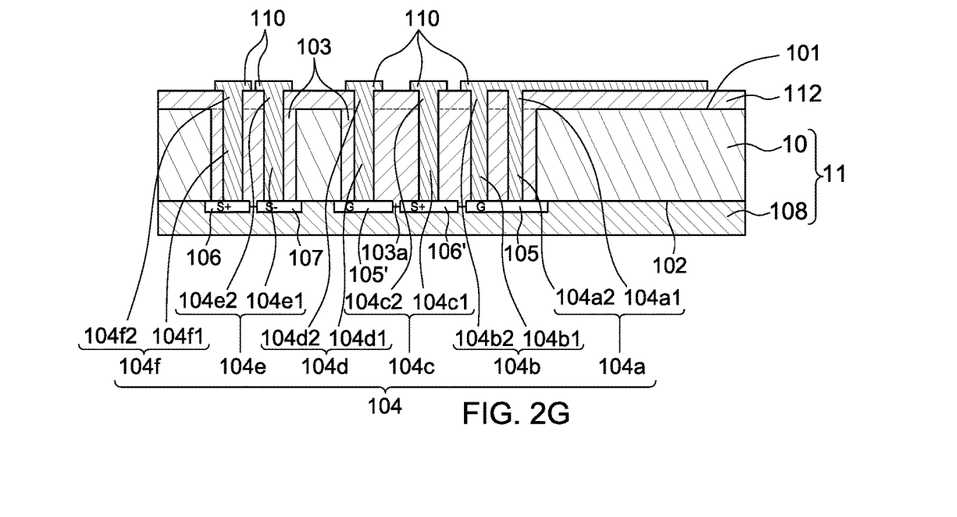

Referring to FIG. 2G, conductive posts 104 are formed in the holes 204a, 204b, 204c, 204d, 204e, and 204f. A patterned conductive layer 110 is formed on the insulation layer 112 and the conductive posts 104. The conductive posts 104 and the patterned conductive layer 110 may be formed in a single operation. The conductive posts 104 and the patterned conductive layer 110 may be formed by, for example, a plating technique or another suitable technique.

Subsequent to the formation of the patterned conductive layer 110, an additional insulation layer (e.g., the insulation layer 113 in FIG. 1) may be laminated on the insulation layer 112 and the patterned conductive layer 110, and a portion of the additional insulation layer may be removed to expose portions of the patterned conductive layer 110. The additional insulation layer 113 may include, for example, a photosensitive material. A connection element (e.g., the connection element 111 in FIG. 1) may be formed on the exposed patterned conductive layer 110 to form the semiconductor device package 1 as described and illustrated with reference to FIG. 1.

Figure 3A:
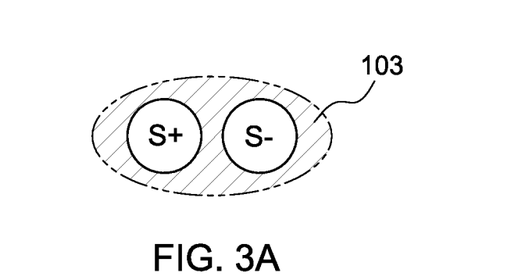
FIG. 3A illustrates a layout of conductive pads in a semiconductor device package in accordance with an embodiment of the present disclosure.

FIG. 3A illustrates a top view of a layout for a pair of differential signal conductive pads (e.g., the conductive pads 106, 107 of FIG. 1) in accordance with an embodiment of the present disclosure. The pair of conductive pads is designed such that a first of the conductive pads is for connection to a first signal path and a second of the conductive pads is for connection to a second signal path, and the pair of pads (and the corresponding pair of signal paths) is designed to carry complementary signals. The term complementary with respect to two signals refers to approximately equal magnitude and approximately opposite phase. The two pads are separated by an insulation body 103. A pitch between the two pads may be flexibly designed because the pads are formed by photolithography. The pitch may be designed from approximately 70 µm to approximately 110 µm to improve a performance of differential signals.

Figure 3B:
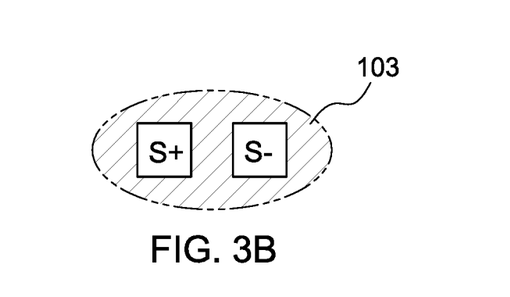
FIG. 3B illustrates a layout of conductive pads in a semiconductor device package in accordance with an embodiment of the present disclosure.

FIG. 3B illustrates a top view of a layout for a pair of differential signal conductive pads in accordance with an embodiment of the present disclosure. The layout of FIG. 3B is similar to that of FIG. 3A, but a shape of the conductive pads of FIG. 3B is designed as a square or rectangle instead of circular as in FIG. 3A.

Figure 4A:
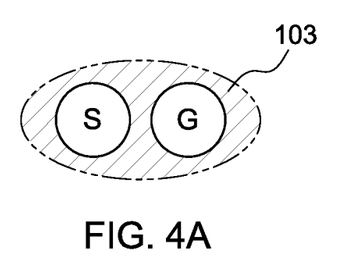
FIG. 4A illustrates a layout of conductive pads in a semiconductor device package in accordance with an embodiment of the present disclosure.

FIG. 4A illustrates a top view of a layout for two conductive pads in accordance with an embodiment of the present disclosure. The conductive pads are designed such that a first of the conductive pads ('S') is for connection to a signal path pad and a second of the conductive pads ('G') is for connection to a ground path. The two pads are separated by an insulation body 103. A pitch between the two pads may be flexibly designed because the pads are formed by photolithography. The pitch may be designed from approximately 70 µm to approximately 110 µm to improve a performance of signal and ground paths.

Figure 4B:
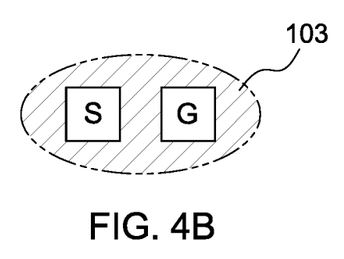
FIG. 4B illustrates a layout of conductive pads in a semiconductor device package in accordance with an embodiment of the present disclosure.

FIG. 4B illustrates a top view of a layout for a pair of conductive pads in accordance with an embodiment of the present disclosure. The layout of FIG. 4B is similar to that of FIG. 4A, but a shape of the conductive pads of FIG. 4B is designed as a square or rectangle instead of circular as in FIG. 4A.

Figure 4C:
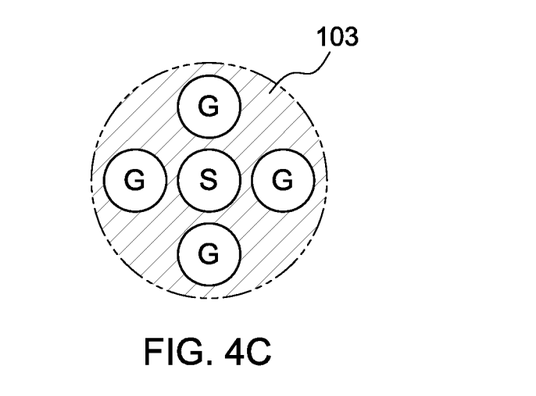
FIG. 4C illustrates a layout for conductive pads of a semiconductor device package in accordance with an embodiment of the present disclosure.

FIG. 4C illustrates a top view of a layout for five conductive pads in accordance with an embodiment of the present disclosure, in which a signal pad ('S') is surrounded by four grounding pads ('G'). The layout may improve a ground shielding effect.

Figure 4D:
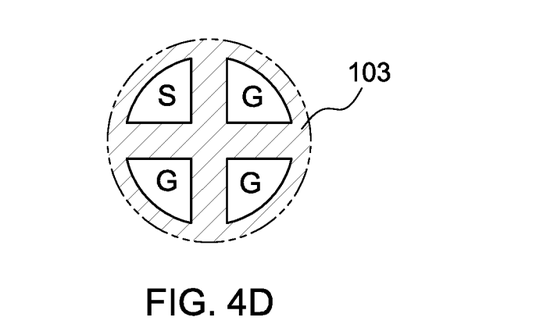
FIG. 4D illustrates a layout of conductive pads in a semiconductor device package in accordance with an embodiment of the present disclosure.

FIG. 4D illustrates a top view of a layout for four conductive pads in accordance with an embodiment of the present disclosure, in which a signal pad ('S') and three grounding pads ('G') each have a quarter circle shape.

Figure 5:
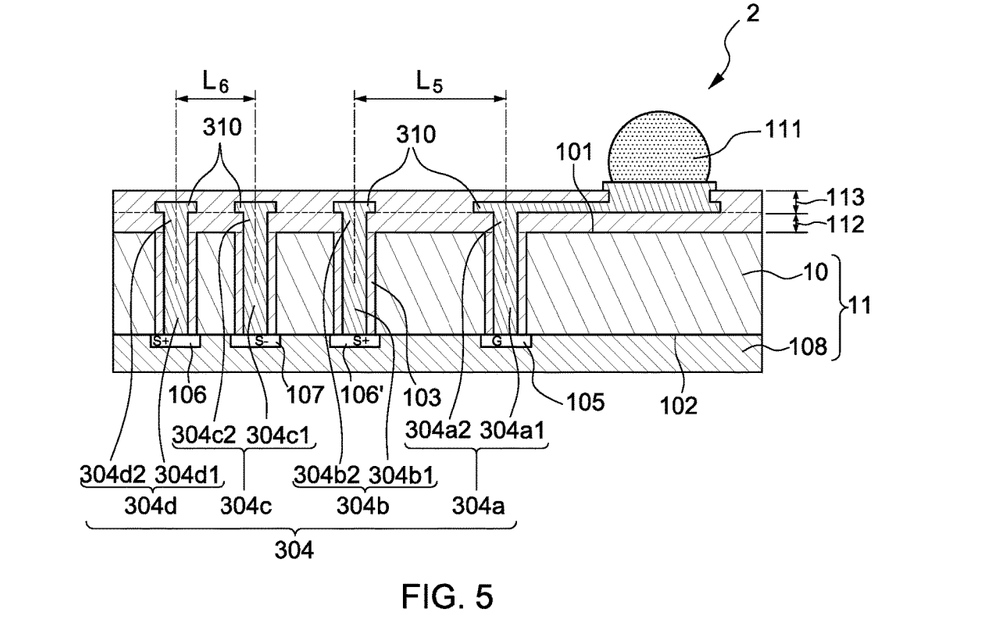
FIG. 5 illustrates a cross-sectional view of a semiconductor device package in accordance with an embodiment of the present disclosure.

FIG. 5 is a cross-sectional view of a semiconductor device package 2. The semiconductor device 2 includes a die 11, an insulation body 103, conductive posts 304, a patterned conductive layer 310, a connection element 111, and insulation layers 112 and 113.

The conductive posts 304 may include conductive posts 304a, 304b, 304c and 304d. Each of the conductive posts 304a, 304b, 304c and 304d has a lower portion 304a1, 304b1, 304c1 and 304d1 and a higher portion 304a2, 304b2, 304c2 and 304d2. Each of the lower portion 304a1, 304b1, 304c1 and 304d1 is within the insulation body 103 and is formed in a through hole (not labelled in FIG. 5) of a semiconductor substrate 10.

The conductive post 304a is separated from the conductive post 304b by a pitch L5 of approximately 110 µm to approximately 130 µm. The conductive post 304c is separated from the conductive post 304d by a pitch L6 of approximately 110 µm to approximately 130 µm.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
a semiconductor substrate having a first surface and a second surface opposite the first surface, the semiconductor substrate defining a plurality of spaces extending from the second surface to the first surface;
an insulation body disposed in one of the plurality of spaces and between the first surface and the second surface, the insulation body comprising a photo-sensitive resin, wherein the insulation body defines a plurality of holes that are formed by a photolithography operation in the insulation body;
a plurality of conductive posts in the insulation body; and
an active layer disposed on the second surface of the semiconductor substrate, the active layer comprising a grounding pad on the second surface, wherein the plurality of conductive posts comprises a first conductive post and a second conductive post, and the first conductive post and the second conductive post are disposed on and electrically connected to the grounding pad, and wherein the active layer further comprises a first signal pad and a second signal pad disposed on the second surface, the plurality of conductive posts further comprises a third conductive post disposed on and electrically connected to the first signal pad and a fourth conductive post disposed on and electrically connected to the second signal pad, and the third conductive post and the fourth conductive post are configured to transfer differential signals.

2. The semiconductor device package of claim 1, wherein each of the conductive posts is separated from an adjacent one of the conductive posts by a distance of approximately 70 micrometers to approximately 110 micrometers.

3. The semiconductor device package of claim 1, wherein the insulation body further comprises a protrusion from the second surface of the semiconductor substrate toward a direction away from the first surface of the semiconductor substrate.

4. The semiconductor device package of claim 1, wherein at least one of the plurality of conductive posts extends from the second surface to the first surface.

5. The semiconductor device package of claim 1, wherein the first conductive post and the second conductive post are configured to match impedance.

6. The semiconductor device package of claim 1, wherein the plurality of spaces comprises a first space and a second space, the first space exposes the grounding pad, and the second space exposes the first signal pad and the second signal pad.

7. The semiconductor device package of claim 6, wherein a dimension of the first space is greater than a dimension of the second space.

8. The semiconductor device package of claim 1, wherein each of the plurality of conductive posts is disposed in a corresponding hole of the plurality of holes.

9. A semiconductor device package, comprising:
a semiconductor substrate having a first surface and a second surface opposite the first surface, the semiconductor substrate defining a plurality of spaces extending from the second surface to the first surface;
an insulation body disposed in one of the plurality of spaces and between the first surface and the second surface;
an active layer disposed on the second surface of the semiconductor substrate, the active layer comprising a grounding pad, a first signal pad and a second signal pad; and
a plurality of conductive posts disposed in the insulation body, the plurality of conductive posts comprising:
a first conductive post and a second conductive post disposed on and electrically connected to the grounding pad, wherein the first conductive post and the second conductive post are configured to match impedance; and
a third conductive post disposed on and electrically connected to the first signal pad, and a fourth conductive post disposed on and electrically connected to the second signal pad, wherein the third conductive post and the fourth conductive post are configured to transfer differential signals.

10. The semiconductor device package of claim 9, wherein each of the conductive posts is separated from an adjacent one of the conductive posts by a distance of approximately 70 micrometers to approximately 110 micrometers.

11. The semiconductor device package of claim 9, wherein the insulation body further comprises a protrusion from the second surface of the semiconductor substrate toward a direction away from the first surface of the semiconductor substrate, and the protrusion is disposed between the first signal pad and the second signal pad.

12. The semiconductor device package of claim 9, wherein the insulation body encapsulates the first, second, third and fourth conductive posts.

13. The semiconductor device package of claim 9, wherein the insulation body covers the semiconductor substrate and the first, second, third and fourth conductive posts.

14. The semiconductor device package of claim 9, wherein the plurality of spaces comprises a first space and a second space, the first space exposes the grounding pad, and the second space exposes the first signal pad and the second signal pad.

15. The semiconductor device package of claim 14, wherein the active layer further comprises a third signal pad exposed by the first space, and the plurality of conductive posts further comprises a fifth conductive post disposed on and electrically connected to the third signal pad.

16. The semiconductor device package of claim 14, wherein a dimension of the first space is greater than a dimension of the second space.

17. The semiconductor device package of claim 9, wherein each of the plurality of conductive posts is surrounded by and separated by the insulation body.

* * * * *